(12) United States Patent
Chu

(10) Patent No.: US 10,181,400 B2
(45) Date of Patent: Jan. 15, 2019

(54) III-NITRIDE TRANSISTOR WITH ENHANCED DOPING IN BASE LAYER

(71) Applicant: HRL LABORATORIES LLC, Malibu, CA (US)

(72) Inventor: Rongming Chu, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/610,430

(22) Filed: May 31, 2017

(65) Prior Publication Data

US 2017/0263769 A1    Sep. 14, 2017

Related U.S. Application Data

(62) Division of application No. 14/471,980, filed on Aug. 28, 2014, now Pat. No. 9,761,709.

(51) Int. Cl.
*H01L 21/02* (2006.01)
*H01L 21/20* (2006.01)
(Continued)

(52) U.S. Cl.
CPC ...... *H01L 21/0254* (2013.01); *H01L 21/2056* (2013.01); *H01L 29/2003* (2013.01); *H01L 29/205* (2013.01); *H01L 29/4236* (2013.01); *H01L 29/66522* (2013.01); *H01L 29/66666* (2013.01); *H01L 29/7813* (2013.01); *H01L 29/7827* (2013.01); *H01L 21/02458* (2013.01);
(Continued)

(58) Field of Classification Search
CPC ........... H01L 29/7813; H01L 29/66734; H01L 29/1095
See application file for complete search history.

(56) References Cited

U.S. PATENT DOCUMENTS 6,580,101 B2   6/2003   Yoshida
8,426,895 B2   4/2013   Okamoto et al.
(Continued)

OTHER PUBLICATIONS

"Vertical GaN-based trench metal oxide semiconductor fieldeffect transistors on a free-standing GaN substrate with blocking voltage of 1.6 kV", by Tohru Oka, Yukihisa Ueno, Tsutomu Ina, and Kazuya Hasegawa (Applied Physics Express 7, 021002 2 (2014)).
(Continued)

*Primary Examiner* — Victor A Mandala
*Assistant Examiner* — Regan J Rundio
(74) *Attorney, Agent, or Firm* — Ladas & Parry

(57) ABSTRACT

A vertical trench MOSFET comprising: a N-doped substrate of a III-N material; and an epitaxial layer of the III-N material grown on a top surface of the substrate, a N-doped drift region being formed in said epitaxial layer; a P-doped base layer of said III-N material, formed on top of at least a portion of the drift region; a N-doped source region of said III-N material; formed on at least a portion of the base layer; and a gate trench having at least one vertical wall extending along at least a portion of the source region and at least a portion of the base layer; wherein at least a portion of the P-doped base layer along the gate trench is a layer of said P-doped III-N material that additionally comprises a percentage of aluminum.

8 Claims, 2 Drawing Sheets

(51) Int. Cl.
| | |
|---|---|
| H01L 21/336 | (2006.01) |
| H01L 29/205 | (2006.01) |
| H01L 29/78 | (2006.01) |
| H01L 29/423 | (2006.01) |
| H01L 29/20 | (2006.01) |
| H01L 29/66 | (2006.01) |
| H01L 21/205 | (2006.01) |
| H01L 29/207 | (2006.01) |
| H01L 29/778 | (2006.01) |
| H01L 29/201 | (2006.01) |
| H01L 21/306 | (2006.01) |

(52) U.S. Cl.
CPC .......... *H01L 21/306* (2013.01); *H01L 29/201* (2013.01); *H01L 29/7788* (2013.01)

(56) References Cited

U.S. PATENT DOCUMENTS

| | | | |
|---|---|---|---|
| 8,890,239 | B2 | 11/2014 | Yaegashi et al. |
| 9,761,709 | B2 | 9/2017 | Chu |
| 2001/0032999 | A1* | 10/2001 | Yoshida ............ H01L 29/66674 257/332 |
| 2002/0167023 | A1 | 11/2002 | Chavarkar et al. |
| 2008/0079009 | A1 | 4/2008 | Yaegashi |
| 2009/0072272 | A1 | 3/2009 | Suh et al. |
| 2009/0114923 | A1* | 5/2009 | Iwamuro ............. H01L 29/0661 257/77 |
| 2010/0006894 | A1 | 1/2010 | Ohta et al. |
| 2010/0224910 | A1 | 9/2010 | Ando et al. |
| 2011/0204381 | A1 | 8/2011 | Okada |
| 2011/0235665 | A1* | 9/2011 | Simon ............... H01L 21/02389 372/44.011 |
| 2012/0199889 | A1 | 8/2012 | Miyamoto et al. |
| 2012/0228674 | A1 | 9/2012 | Okamoto |
| 2013/0043468 | A1 | 2/2013 | Adekore |
| 2013/0316507 | A1 | 11/2013 | Saitoh et al. |
| 2015/0060876 | A1* | 3/2015 | Xing ................... H01L 29/7787 257/76 |

OTHER PUBLICATIONS

"Two-dimensional electron gases induced by spontaneous and piezoelectric", by O. Ambacher et al.; Journal of Applied Physics vol. 85, No. 6; Mar. 15, 1999.

"Two dimensional electron gases induced by spontaneous and piezoelectric polarization in undoped and doped AlGaN/GaN heterostructures" by O. Ambacher et al.; Journal of Applied Physics vol. 87, No. 11; Jan. 2000.

Dimitrov et al. "Comparison of N-face and Ga-face AlGaN/GaN-based high electron mobility transistors grown by plasmainduced molecular beam epitaxy." Japanese journal of applied physics 38.9R (1999): 4962.

Okada et al. "Novel Vertical Heterojunction Field-Effect Transistors With Re-Grown AlGaN/GaN Two-Dimensional Electron Gases Channels on GaN Substrates," Applied Physics Express 3, pp. 054201-1-054201-3, Apr. 16, 2010.

Piprek, Ultra-violet light-emitting diodes with quasi acceptor-free AlGaN polarization doping; Optical and Quantum Electronics, Jun. 2012, vol. 44, Issue 3, pp. 67-73.

From PCT/US2015/045360, PCT International Search Report and Written Opinion (ISR & WO) dated Nov. 25, 2015.

From PCT/US2015/045360, PCT International Preliminary Report on Patentability (IPRP; Chapter I) with Written Opinion dated Feb. 28, 2017.

From U.S. Appl. No. 14/471,980 (now U.S. Pat. No. 9,761,709) Restriction Requirement dated Aug. 20, 2015.

From U.S. Appl. No. 14/471,980 (now U.S. Pat. No. 9,761,709) Non Final Office Action dated Dec. 2, 2015.

From U.S. Appl. No. 14/471,980 (now U.S. Pat. No. 9,761,709) Final Office Action dated Mar. 7, 2016.

From U.S. Appl. No. 14/471,980 (now U.S. Pat. No. 9,761,709) Non Final Office Action dated May 31, 2016.

From U.S. Appl. No. 14/471,980 (now U.S. Pat. No. 9,761,709) Final Office Action dated Sep. 19, 2016.

From U.S. Appl. No. 14/471,980 (now U.S. Pat. No. 9,761,709) Non Final Office Action dated Jan. 3, 2017.

From U.S. Appl. No. 14/471,980 (now U.S. Pat. No. 9,761,709) Notice of Allowance dated May 11, 2017.

Extended European Search Report from European Patent Application No. 15835371.4 dated Apr. 5, 2018.

Li, Liang, et al: "Reduction of threading dislocations in N-polar GaN using a pseudomorphicaly grown graded-Al-fraction AlGaN interlayer", Journal if Crystal Growth, vol. 387, Feb. 1, 2014 (Feb. 1, 2014), pp. 1-5, Amsterdam, NL.

Murphy, M.J. et al: "Molecular beam epitaxial growth of normal and inverted two-dimensional electron gases in AlGaN/GaN based heterostructures," Journal of Vacuum Science & Technology B: Microelectronicsprocessing and Phenomena, American Vacuum Society, New York. NY, U.S., vol. 17, No. 3, Jun. 30, 1999 (Jun. 30, 1999), pp. 1252-1254.

Polyakov, V.M. et al: "Impact of Al content on transport properties of two-dimensional electron gas in $GaN/Al_xGa_{1-x}N/GaN$ heterostructures", Applied Physics Letters, A I P Publishing LLC, US, vol. 97, No. 14, Oct. 8, 2010 (Oct. 8, 2010), pp. 142112-142112.

* cited by examiner

III-NITRIDE TRANSISTOR WITH ENHANCED DOPING IN BASE LAYER

CROSS REFERENCE TO RELATED APPLICATION

The present disclosure claims the benefit of and is a divisional of U.S. patent application Ser. No. 14/471,980 filed on Aug. 28, 2014, which is hereby incorporated by reference in its entirety.

FIELD OF THE INVENTION

The present invention relates generally to III-Nitride transistors, and in particular to a GaN based vertical trench MOSFETs.

BACKGROUND

GaN-based transistors are increasingly used in power devices. AlGaN/GaN-based lateral field-effect transistors, wherein polarization charges at the heterointerface produce a high-density, high-mobility two-dimensional electron gas (2DEG) and thus effectively reduce the on-state resistance, are predominantly used. Lateral GaN transistors can be fabricated on low-cost, large-diameter Si substrates. However, the threshold voltage of most lateral GaN transistors is not high enough for use in high-power applications such as automotive applications, where a threshold voltage above 3-5 V is preferred in order to prevent false operation caused by noise. Furthermore, in these transistors increasing the breakdown voltage is achieved by increasing the gate-drain spacing, which reduces the effective current density and increases the chip size and cost for a required amperage rating.

Alternatively, vertical GaN devices on free-standing GaN substrates have been attracting attention. In vertical devices the breakdown voltage is increased by increasing the thickness of the drift region without sacrificing the device size, so that high-power density chips can be realized. The paper "Vertical GaN-based trench metal oxide semiconductor field-effect transistors on a free-standing GaN substrate with blocking voltage of 1.6 kV", by Tohru Oka, Yukihisa Ueno, Tsutomu Ina, and Kazuya Hasegawa (Applied Physics Express 7, 021002 (2014)), discloses vertical GaN-based trench metal-oxide-semiconductor field-effect transistors on a free-standing GaN substrate having a blocking voltage of 1.6 kV.

FIG. 1 illustrates schematically a prior art Vertical GaN-based trench MOSFET 10 on a free-standing GaN substrate 12. Substrate 12 is a strongly N doped GaN substrate 12, on which is formed a GaN epitaxial layer 14. A lightly N-doped drift region 16 is formed in the bottom of layer 14, on top of substrate 12. According to the present disclosure, lightly doped can mean having a doping lower than $1E18$ $cm^{-3}$. A strongly P-doped base layer 18 is formed in layer 14 on top of drift region 16, and a strongly N-doped source region 20 is formed on top of base layer 18. According to the present disclosure, strongly doped can mean having a doping higher than $1E18$ $cm^{-3}$. A source contact 22 can be formed on source region 20. A gate trench 24 having at least one vertical wall 26 extending along a portion of source region 20 and a portion of base layer 18, has a bottom wall 28 in contact with the drift region 16. An insulating layer 30 covers the inside of trench 24. A gate region 32 can be formed on top of insulating layer 30. A gate contact 34 can be formed on gate region 32. A drain contact 35 can be formed on the bottom of substrate 12.

The P-doping of base layer 18 can be accomplished by incorporating a P-dopant, such as magnesium, in epitaxial layer 14. It has been noted however that P-type doping in GaN is usually inefficient. This is because: 1. magnesium dopants in GaN are largely passivated by hydrogen atoms; 2. magnesium doping has a high ionization energy. Insufficient P-type doping in GaN leads to reduced performances of the transistor 10, such as low threshold voltage and high base resistance.

SUMMARY

The present disclosure relates to a vertical III-N trench MOSFET, such as a vertical GaN trench MOSFET, wherein at least a portion of the P-doped base layer along the gate trench comprises a percentage of aluminum, thus forming an heterostructure with regions below and/or above.

An embodiment of the present disclosure relates to a vertical trench MOSFET comprising a N-doped substrate of a III-N material; an epitaxial layer of the III-N material grown on a top surface of the substrate, a N-doped drift region being formed in said epitaxial layer; a P-doped base layer of said III-N material, the base layer being formed on top of at least a portion of the drift region; a N-doped source region of said III-N material; the source region being formed on at least a portion of the base layer; and a gate trench having at least one vertical wall extending along at least a portion of the source region and at least a portion of the base layer; wherein at least a portion of the P-doped base layer along the gate trench is a layer of said P-doped III-N material that additionally comprises a percentage of aluminum.

According to an embodiment of the present disclosure, said III-N material is GaN.

According to an embodiment of the present disclosure, the percentage of aluminum in the layer of said P-doped III-N material varies vertically, (or along a direction normal to the plane of the substrate, as opposed to the plane of the surface that represents a horizontal plane).

According to an embodiment of the present disclosure, the percentage of aluminum is lower than 20%.

According to an embodiment of the present disclosure, the layer of said P-doped III-N material that additionally comprises a percentage of aluminum is an AlGaN layer grown on a Ga face of an underlying GaN layer; wherein the percentage of aluminum of the AlGaN layer decreases from bottom to top (where e.g. epitaxial growth normal to the surface of the substrate grows from bottom to top).

According to an embodiment of the present disclosure, the percentage of aluminum decreases from 20 to 0% from bottom to top.

According to an embodiment of the present disclosure, said layer of said P-doped III-N material that additionally comprises a percentage of aluminum is an AlGaN layer grown on a N face of an underlying GaN layer; wherein the percentage of aluminum of the AlGaN layer increases from bottom to top.

According to an embodiment of the present disclosure, the percentage of aluminum increases from 0 to 20% from bottom to top.

According to an embodiment of the present disclosure, said layer of the P-doped base layer that additionally comprises a percentage of aluminum is grown on a P-doped base layer formed in the epitaxial layer on top of the drift region.

The present disclosure, also relates to a method of fabricating vertical trench MOSFET comprising: providing a substrate of strongly N-doped III-N material; forming on the substrate an epitaxial layer of the III-N material; forming in the epitaxial layer a lightly N-doped drift region of a III-N material, in contact with the substrate; forming on the epitaxial layer a strongly P-doped region of said III-N material comprising a percentage of aluminum; forming on the base layer a strongly N-doped source region of said III-N material; and forming a gate trench having at least one vertical wall extending along at least a portion of the source region and at least a portion of the base layer.

According to an embodiment of the present disclosure, said III-N material is GaN.

According to an embodiment of the present disclosure, the percentage of aluminum varies vertically.

According to an embodiment of the present disclosure, said forming on the epitaxial layer a strongly P-doped region of said III-N material comprising a percentage of aluminum comprises growing an AlGaN layer on a Ga face of the GaN Epitaxial layer; wherein the percentage of aluminum of the AlGaN layer decreases from bottom to top.

According to an embodiment of the present disclosure, said underlying GaN layer is a strongly P-doped region formed in said epitaxial layer above the lightly N-doped drift region.

According to an embodiment of the present disclosure, the percentage of aluminum decreases from 20 to 0%.

According to an embodiment of the present disclosure, said forming on the epitaxial layer a strongly P-doped region of said III-N material comprising a percentage of aluminum comprises growing an AlGaN layer on an N face of the GaN Epitaxial layer; wherein the percentage of aluminum of the AlGaN layer increases from bottom to top.

According to an embodiment of the present disclosure, the percentage of aluminum increases from 0 to 20%.

According to an embodiment of the present disclosure, said forming on the epitaxial layer a strongly P-doped region of said III-N material comprising a percentage of aluminum comprises growing said region comprising a percentage of aluminum on a P-doped base layer formed in the epitaxial layer on top of the drift region.

The present disclosure also relates to a semiconductor circuit comprising: a first GaN layer; and a second GaN layer grown on the first layer, wherein the second layer comprises a percentage of aluminum that varies with the distance to the first layer.

According to an embodiment of the present disclosure, the second layer is grown on a Ga face of the first layer and the percentage of aluminum decreases when the distance to the first layer increases; or the second layer is grown on a N face of the first layer and the percentage of aluminum increases when the distance to the first layer increases

BRIEF DESCRIPTION OF THE DRAWINGS

The invention(s) may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
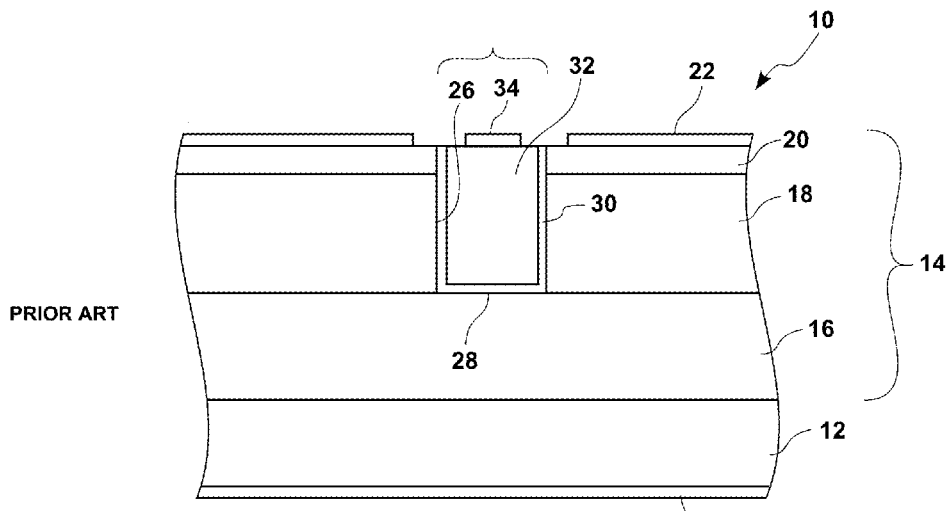
FIG. 1 illustrates a cross-section of a portion of a prior art vertical GaN trench MOSFET.
Figure 2:
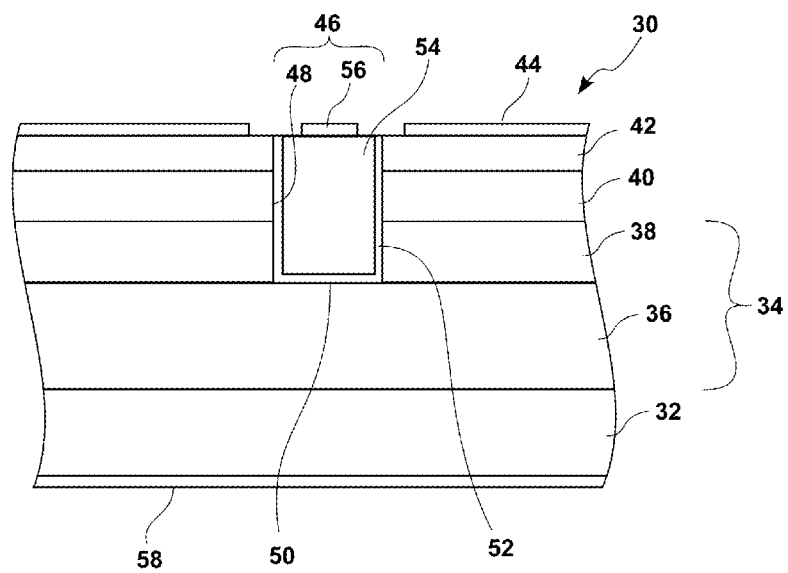
FIG. 2 illustrates a cross-section of a vertical trench MOSFET according to an embodiment of the present disclosure.

FIG. 2 illustrates schematically a Vertical GaN-based trench MOSFET 30 according to an embodiment of the present disclosure. MOSFET 30 comprises a free-standing strongly N doped GaN substrate 32, on which is formed a GaN epitaxial layer 34. A lightly N-doped drift region 36 is formed in the bottom of layer 34, on top of substrate 32. A strongly P-doped base layer 38 is formed in layer 34 on top of drift region 36. According to an embodiment of the present disclosure, the top surface of base layer 38 is a Ga face, or wurtzite Ga face, of the GaN crystal structure, and a layer 40 of P-doped GaN material that additionally comprises a percentage of aluminum was grown on top of base layer 38. According to an embodiment of the present disclosure, substrate 32 is arranged such that the [0001] direction is normal to the surface of the substrate and outward bound, (as opposed to a direction toward the inside of the substrate, which would be inward bound). By Ga-face it is meant that Ga is found on the top position of the {0001} bilayer, corresponding to the [0001] polarity, or GaN(0001). By convention, the [0001] direction is given by a vector pointing from a Ga atom to a nearest-neighbor N atom. It is important to note that the [0001] and [000$\bar{1}$] surfaces of GaN are nonequivalent and differ in their chemical and physical properties. Ga face epitaxial layers can be manufactured by MOCVD (MetalOrganic Chemical Vapor Deposition), as described for example in the document "Two-dimensional electron gases induced by spontaneous and piezoelectric polarization in N- and Ga-Face AlGaN/GaN heterostructures", by O. Ambacher et al.; JOURNAL OF APPLIED PHYSICS VOLUME 85, NUMBER 6; 15 Mar. 1999.

According to an embodiment of the present disclosure, MOSFET 30 comprises a layer 40 of AlGaN grown on the Ga face of base layer 38. According to an embodiment of the present disclosure, MOSFET 30 further comprises a strongly N-doped GaN source region 42 grown on top of AlGaN layer 40. Base layer 38 and layer 40 form together a base layer or region of MOSFET 30.

A source contact 44 can be formed on source region 42. A gate trench 46 having at least one vertical wall 48 extends along a portion of source region 42 and a portion of base layer 40, 38, and has a bottom wall 50, preferably in contact with the drift region 36. An insulating layer 52 covers the inside of trench 46. A gate region 54 can be formed on top of insulating layer 52. A gate contact 56 can be formed on gate region 54. A drain contact 58 can be formed on the bottom of substrate 32.

According to an embodiment of the present disclosure, the percentage of aluminum of AlGaN layer 40 decreases from bottom (at the interface with base layer 38) to top (at the interface with source layer 42). According to an embodiment of the present disclosure, the percentage of aluminum in layer 40 can be of 20% at the junction with base layer 38 and 0% at the junction with source region 42. The document "*Two dimensional electron gases induced by spontaneous and piezoelectric polarization in undoped and doped AlGaN/GaN heterostructures*" by O. Ambacher et al.; JOURNAL OF APPLIED PHYSICS VOLUME 87, NUMBER 11; JANUARY 2000, hereby incorporated by reference, teaches that in a GaN/AlGaN/GaN heterostructure with Ga-face polarity, a 2DEG is formed close to the lower AlGaN/GaN interface due to the piezoelectric and spontaneous polarization in the heterostructure. The Ambacher document does not teach an AlGaN layer having an aluminum percentage that varies.

The present disclosure provides a GaN/AlGaN/GaN heterostructure such as comprising regions/layers 42, 40 and 38 with a variable percentage of aluminum in the AlGaN layer 40, wherein AlGaN layer 40 is formed on a Ga face GaN region 38 and wherein the percentage of aluminum decreases from bottom to top. The decreasing aluminum composition in layer 40 generates a built-in polarization electric field which assists ionization of P-type dopants to form higher concentration of holes in the base layer. According to an embodiment of the present disclosure, higher hole concentration in the base layer enhances the threshold voltage, and reduces the base resistance.

According to an embodiment of the present disclosure, the percentage of aluminum in region 40 varies continuously. It can vary linearly but can also vary non-linearly, depending on the desired repartition of holes in region 40. According to an embodiment of the present disclosure, the percentage of aluminum in region 40 can vary from 0 at the top to 20% at the bottom. The percentage of aluminum in region 40 can also vary along different ranges.

According to an embodiment of the present disclosure, region 40 can comprise a layer of GaN (layer xx) on top of a layer of AlGaN (layer yy) with a constant aluminum composition in the AlGaN layer. In such a case, the concentration peak of the holes in region 40 will be at the interface between layer xx and layer yy.

According to an embodiment of the present disclosure, the top surface of base layer 38 can alternatively be a N face, or wurtzite N face, of the GaN crystal. In such an embodiment, substrate 32 is arranged such that the [000$\bar{1}$] direction is normal to the surface of the substrate and outward bound. N-face epitaxial layers can be manufactured by PIMBE (Plasma Induced Molecular Beam Epitaxy), as described for example in the document "*Two-dimensional electron gases induced by spontaneous and piezoelectric polarization in N- and Ga-Face AlGaN/GaN heterostructures*", by O. Ambacher et al.; JOURNAL OF APPLIED PHYSICS VOLUME 85, NUMBER 6; 15 Mar. 1999, hereby incorporated by reference.

According to such an embodiment of the present disclosure, the percentage of aluminum of AlGaN layer 40 increases from bottom to top because in pseudomorphic GaN/AlGaN/GaN heterostructures with N-face polarity, electrons are located close to the upper GaN/AlGaN interface. The percentage of aluminum of AlGaN layer 40 increases from bottom to top so that the built-in polarization electric-field assists generation of holes in layer 40.

According to embodiments of the present disclosure, a P-type dopant can be magnesium, wherein doping with Mg is conducted by introducing magnesium precursors during the MOCVD or MBE growth of the (Al)GaN layer.

Figure 3:
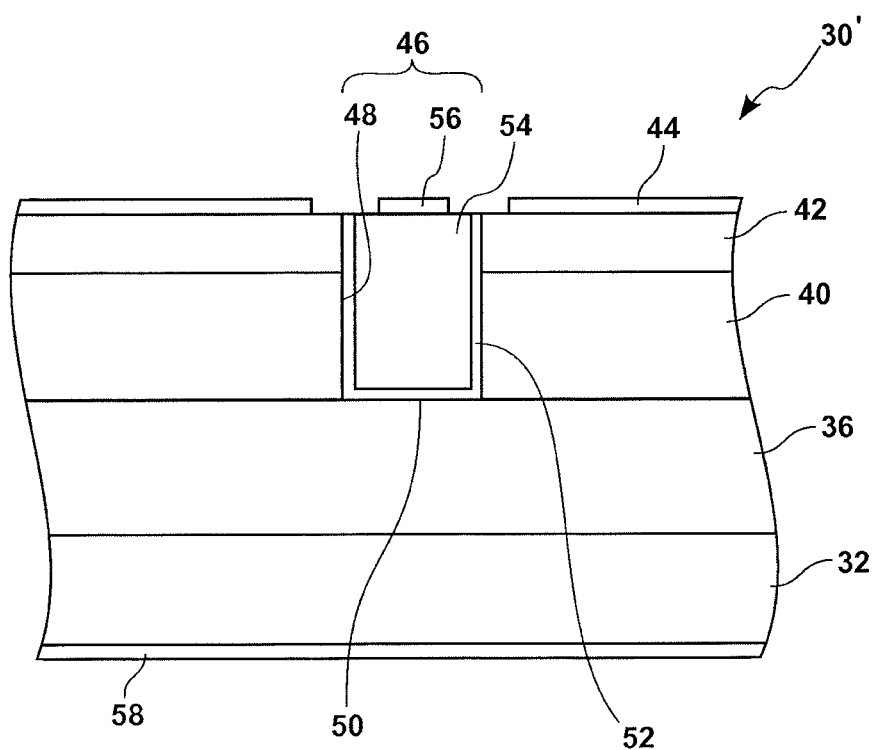
FIG. 3 illustrates a cross-section of a vertical trench MOSFET according to an embodiment of the present disclosure.

FIG. 3 illustrates a vertical MOSFET 30' according to an embodiment of the present disclosure, where region 40 was grown directly on the top of drift region 36. MOSFET 30' is identical in structure to MOSFET 30 as shown in FIG. 2, except that it comprises no epitaxial base layer 38. In MOSFET 30', the base layer is entirely comprised of region 40. According to an embodiment of the present disclosure, a preferred height of region 40 is 200 nm to 2 um. An embodiment as illustrated in FIG. 2, with a base layer 38, can have a thicker base than an embodiment a illustrated in FIG. 3.

It is noted that a HEMT according to embodiments of the present disclosure will be suitable for High Voltage GaN device applications including Electrical Vehicles, Trucks, Traction application, HV transmission lines and naval applications where high efficient power switches are required. The total available market of discrete power devices is expected to reach $ 20 Billion by 2020. The HV market in which HV GaN HEMT can target is estimated at $ 8 Billion by 2020. The insertion of GaN based power devices in the aforementioned applications is of significant interest to car manufacturers, as well as energy and defense industries, due to the superior material properties of GaN HEMTs. Further, GaN based power devices are considered to be the main candidate to lead future roadmaps of energy efficient products. HEMTs according to the present disclosure are particularly useful in applications that require 1200V blocking capability, for example for the electrification of next generation vehicles. The global requirement for CO2 emission reduction and the drive in the U.S. to reduce dependence on foreign oil are driving the market pull for energy efficient semiconductor devices that are superior in performance to the existing Silicon device which will enable operations at higher temperature that are not addressed by smaller band-gap (Eg=1.1 eV) of silicon based power devices.

The foregoing description of the preferred embodiments of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated.

For example, the present disclosure was made with respect to adding aluminum to the GaN material of a base layer of a vertical trench transistor to enhance the P doping of the base layer. However, the present disclosure is not limited to the above-disclosed materials or structures. For example, one can add indium to the GaN material instead of aluminum, or one can replace GaN by ZnO. The descriptions of the figures above are to be read by replacing Aluminum with Indium or GaN with ZnO.

It is intended that the scope of the invention be defined by the claims appended hereto and their equivalents. Reference to an element in the singular is not intended to mean "one and only one" unless explicitly so stated, but rather means "one or more." Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase "means for . . . ."

It should be understood that the figures illustrated in the attachments, which highlight the functionality and advantages of the present invention, are presented for example purposes only. The architecture of the present invention is sufficiently flexible and configurable, such that it may be utilized (and navigated) in ways other than that shown in the accompanying figures.

Furthermore, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

The invention claimed is:

1. A method of fabricating a vertical trench MOSFET having a gate trench; the method comprising:
    providing a substrate of N doped III-N material;
    forming on the substrate an epitaxial layer of the III-N material;
    forming in the epitaxial layer a N-doped drift region of a III-N material, in contact with the substrate;
    forming on the epitaxial layer, on at least a portion of the drift region, a P-doped base layer of said III-N material;
    forming on at least a portion of the base layer a N-doped source region of said III-N material; and
    forming a gate trench of the vertical trench MOSFET, having at least one vertical wall extending along at least a portion of the source region and at least a portion of the base layer;
    wherein at least a portion of the P-doped base layer along the gate trench of the vertical trench MOSFET is a layer of said P-doped III-N material that additionally comprises a percentage of aluminum that varies vertically.

2. The method of claim 1, wherein said III-N material is GaN.

3. The method of claim 2, wherein said forming on the epitaxial layer a P-doped region of said III-N material comprising a percentage of aluminum comprises growing an AlGaN layer on a Ga face of the GaN epitaxial layer; wherein the percentage of aluminum of the AlGaN layer decreases from bottom to top.

4. The method of claim 3, wherein the percentage of aluminum decreases from 20 to 0% from bottom to top.

5. The method of claim 2, wherein said forming on the epitaxial layer a P-doped region of said III-N material comprising a percentage of aluminum comprises growing an AlGaN layer on an N face of the GaN epitaxial layer; wherein the percentage of aluminum of the AlGaN layer increases from bottom to top.

6. The method of claim 5, wherein the percentage of aluminum increases from 0 to 20% from bottom to top.

7. The method of claim 1, wherein said P-doped region of said material additionally comprising a percentage of aluminum that varies vertically is formed on an underlying GaN layer comprising a P-doped region formed in said epitaxial layer above the N-doped drift region.

8. The method of claim 1, wherein said forming on the epitaxial layer a P-doped region of said III-N material comprising a percentage of aluminum comprises growing said region comprising a percentage of aluminum on a P-doped base layer formed in the epitaxial layer on top of the drift region.

* * * * *